United States Patent
Tigelaar

(12) 
(10) Patent No.: US 6,919,605 B2
(45) Date of Patent: Jul. 19, 2005

(54) INTEGRATED CIRCUIT MOS TRANSISTOR WITH REDUCED DRAIN AND SOURCE RESISTANCE

(75) Inventor: Howard Lee Tigelaar, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 38 days.

(21) Appl. No.: 10/650,104

(22) Filed: Aug. 26, 2003

(65) Prior Publication Data

US 2005/0045924 A1 Mar. 3, 2005

(51) Int. Cl.$^7$ ............................................... H01L 29/76
(52) U.S. Cl. ...................................... 257/382; 257/384
(58) Field of Search .................................. 257/384, 335, 257/336, 337, 338, 288, 377, 369, 368, 382, 383, 389, 734, 750, 754, 755, 756, 757, 768, 769, 770; 438/197, 199, 300, 630, 648, 650, 651, 652, 655, 647, 656, 657, 683, 685, 649

(56) References Cited

U.S. PATENT DOCUMENTS 5,747,852 A * 5/1998 Chang et al.
6,630,721 B1 * 10/2003 Ligon

* cited by examiner

Primary Examiner—Nathan J. Flynn
Assistant Examiner—Kevin Quinto
(74) Attorney, Agent, or Firm—Peter K. McLarty; W. James Brady, III; Frederick J. Telecky, Jr.

(57) ABSTRACT

A gate structure (30) is formed on a semiconductor (10). Source and drain extension regions (130) are formed in the semiconductor (10) adjacent to the gate structure (30). Metal silicide layers (140) are formed on the extension regions (130) and sidewall structures (155, 165, and 175) are formed over the metal silicide layers (140). Source and drain regions (120) are formed in the semiconductor (10), and metal silicide layers (180) are formed on the source and drain regions (120).

18 Claims, 5 Drawing Sheets

INTEGRATED CIRCUIT MOS TRANSISTOR WITH REDUCED DRAIN AND SOURCE RESISTANCE

FIELD OF THE INVENTION

This invention relates generally to the field of electronic devices and more particularly to a low resistance integrated circuit MOS transistor and method for forming the same.

BACKGROUND OF THE INVENTION

A typical metal-oxide-semiconductor (MOS) transistor 5 according to the prior art is shown in FIG. 1. Dielectric layer 20 is formed on a semiconductor 10 and a transistor gate structure 30 is formed on the dielectric layer 20. In a self-aligned dopant implantation process, the drain and source extension regions 40 are formed following the formation of the gate structure 30. These drain and source extension regions 40 can be n-type or p-type for NMOS or PMOS transistors respectively. Typically the drain and source extension regions 40 are more lightly doped than the source and drain regions 60 and are referred to as lightly doped drain (LDD) or moderately doped drain (MDD) extension regions depending on the relative doping concentration of the extension regions 40 with respect to the source and drain regions 60. Following the formation of the LDD or MDD regions 40, sidewall structures 50 are formed adjacent to the gate structure 30. The source and drain regions 60 are the formed by implanting dopant species into the semiconductor 10. The implanted dopant species used to form the source and drain regions 60 are self-aligned to the sidewall structures 50. Metal silicide 70 is then formed on both the source and drain 60 and on the gate structure 30 to reduce the resistance associated with these regions.

As described above, the LDD or MDD regions 40 are relatively lightly doped and therefore contribute parasitic resistance to the MOS transistor. Parasitic resistance reduces the performance of the MOs transistor by reducing the voltage that appears across the channel region. As the gate length of the MOS transistor is reduced the parasitic resistances associated with the LDD and MDD regions will become a large limitation in improving the performance of the transistor. There is therefore a need for a MOS transistor with reduced parasitic resistances. The instant invention addresses this need.

SUMMARY OF THE INVENTION

The instant invention comprises a MOS transistor with reduced parasitic resistances. In a first embodiment a MOS transistor comprises a gate structure on a semiconductor. Source and drain regions are formed in the semiconductor on either side of the gate structure and source and drain extension regions are formed on either side of the gate structure between the source and drain regions and the gate structure. Metal silicide is formed on the source and drain extension regions and sidewall structures are formed over the source and drain extension regions and the metal silicide layer adjacent to the gate. Additional metal silicide layers are formed over the source and drain regions. In a further embodiment a semiconductor layer is formed adjacent to the sidewall structures and the source and drain regions and source and drain extension regions are formed in the semiconductor layer and the semiconductor. Metal silicide layers are formed on the semiconductor layer over the source and drain regions and source and drain extension regions.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIG. 2(a) through FIG. 4 illustrate various embodiments of a MOS transistor with reduced resistance according to the instant invention.

Figure 1:
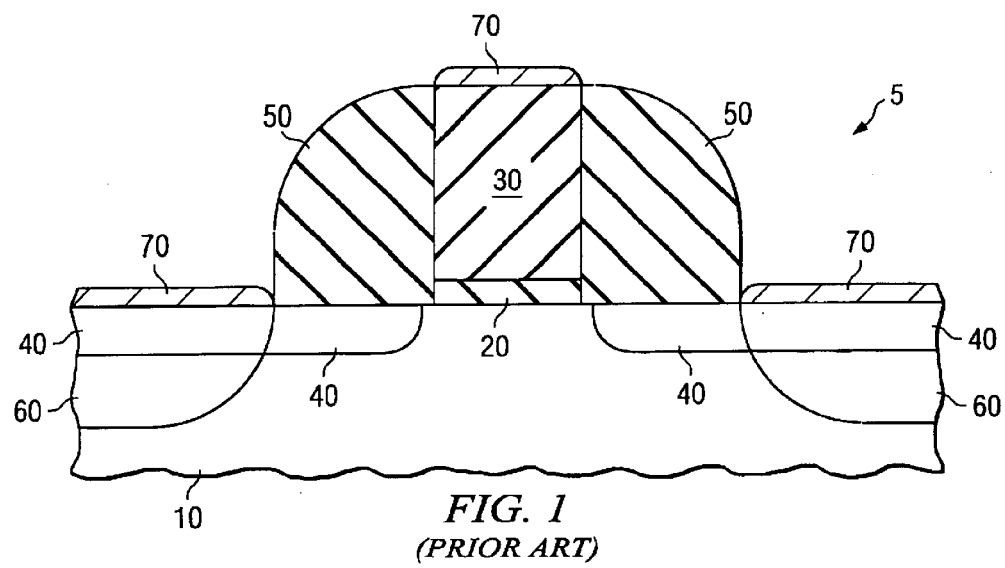
FIG. 1 is a MOS transistor according to the prior art.
Figure 2A:
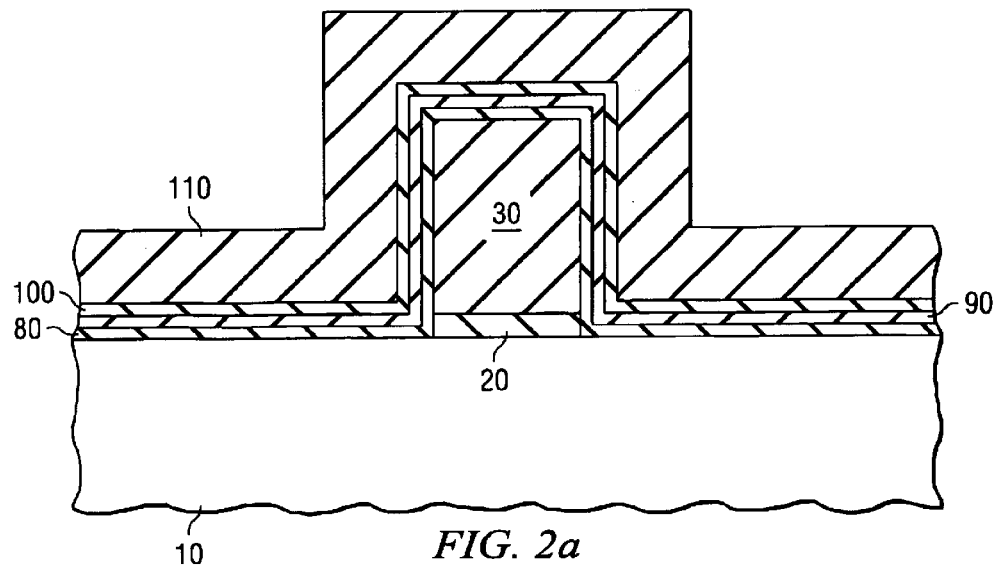
FIGS. 2(a) to 2(f) are cross-sectional diagrams of an embodiment of a MOS transistor according to an embodiment of the instant invention.
Figure 2B:
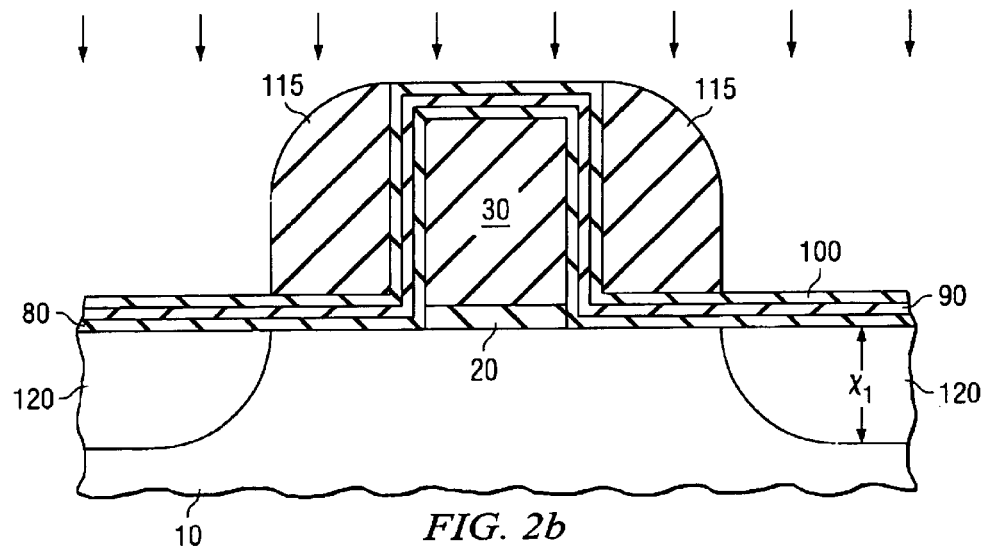
Figure 2C:
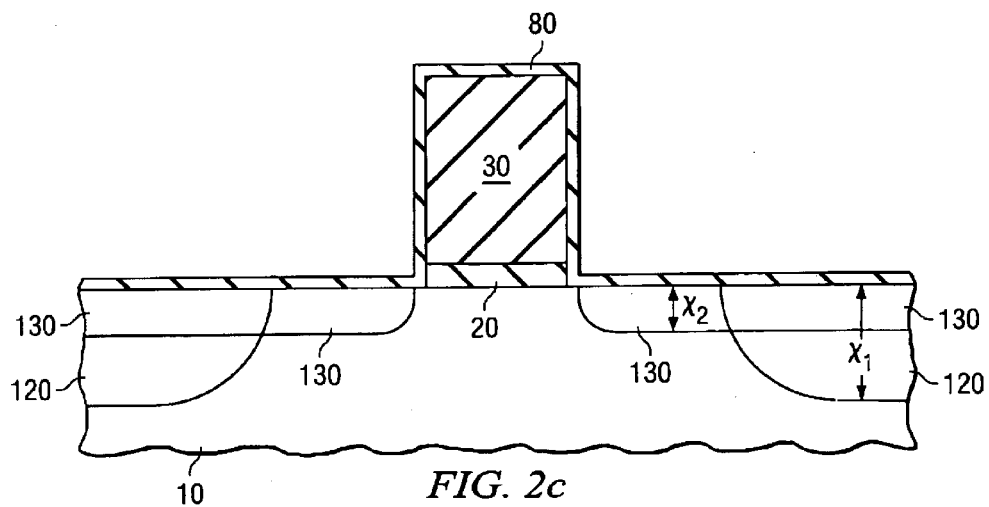

Shown in FIG. 2(a) to FIG. 2(f) is a first embodiment of the instant invention. A MOS transistor gate dielectric 20 is formed on a semiconductor 10. A transistor gate structure 30 is formed on the gate dielectric 20. The gate dielectric 20 can comprise silicon oxide, silicon oxynitride, silicon nitride, hafnium oxide, or any other suitable dielectric material. The transistor gate structure 30 can comprise polycrystalline silicon or any other suitable material. Following the formation of the transistor gate structure 30, replacement sidewall structures are formed. Replacement sidewall structures are formed by first forming a number of dielectric layers over the transistor gate structure 30 and the semiconductor 10. In a first embodiment a silicon oxide layer 80, a silicon nitride layer 90, a silicon oxide layer 100, and a silicon nitride layer 110 are formed over the transistor gate structure 30 and the semiconductor 10. Following the formation of the layers 80, 90, 100, and 110 as shown in FIG. 2(a), an anisotropic etch is performed on the structure of FIG. 2(a) to form the replacement sidewall structures 115 shown in FIG. 2(b). Following the formation of the replacement sidewall structures 115, the source and drain regions 120 are formed. The formation of the source and drain regions 120 comprises performing ion implantation of the dopant species into the semiconductor 10. The implantation of dopant species is self-aligned to the replacement sidewall structures 115. It should be noted that the implantation of the dopant species will result in source and drain regions 120 extending a distance $x_1$ beneath the surface of the semiconductor 10 as shown in FIG. 2(b).

Following the formation of the source and drain regions 120 shown in FIG. 2(b), the replacement sidewall structures 115 are removed along with layers 90 and 100. With the replacement sidewall structures removed, drain and source extension regions 130 are then formed by the ion implantation of dopant species into the semiconductor 10. The drain and source extension regions are often referred to as lightly doped drain (LDD) or moderately doped drain (MDD) regions depending on the relative doping concentrations of the extension regions. The terms drain extension region, LDD and MDD will be used interchangedly throughout this disclosure. The implanted dopant species that form the LDD or MDD regions 130 are self-aligned to the gate structure 30. It should be noted that the implantation of the dopant species will result in LDD or MDD regions 130 extending a distance $x_2$ beneath the surface of the semiconductor 10 as shown in FIG. 2(b). In general the distance $x_2$ will always be less than the distance $x_1$, or in other words, the source and drain regions 120 will extend further beneath the surface of the semiconductor 10 compared to the LDD or MDD regions 130. Also, as stated earlier the doping concentration of the source and drain regions 120 will be greater than the doping concentration of the LDD or MDD regions 130.

Figure 2D:
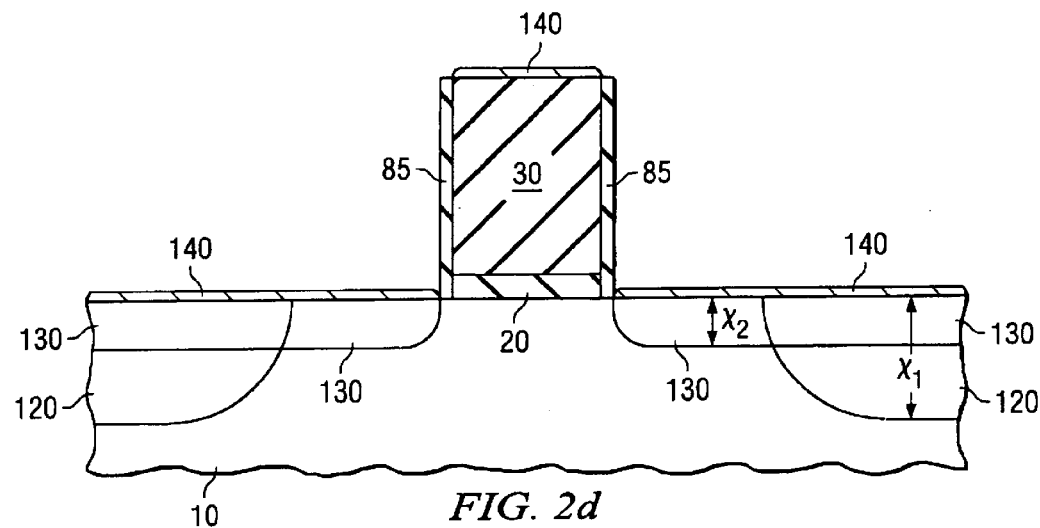
Figure 2E:
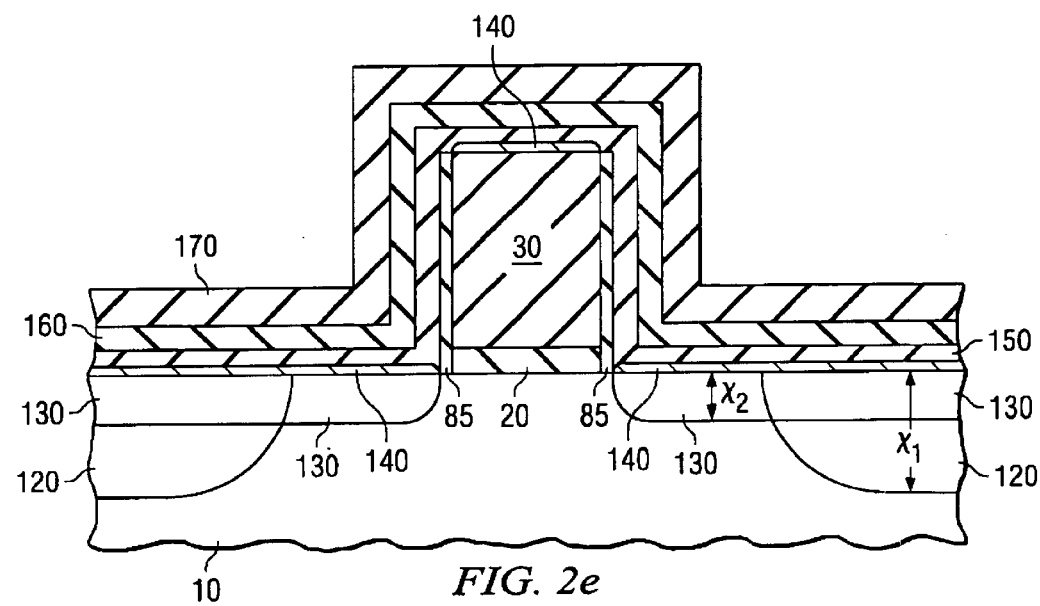

Following the formation of the LDD or MDD extension regions 130, the remaining oxide layer 80 is anisotropically etched and an initial layer of silicide 140 is formed over the exposed silicon surfaces including the LDD and MDD regions 130 as shown in FIG. 2(d). The initial silicide layer 140 can comprise cobalt silicide, titanium silicide, nickel silicide, or any other suitable metal silicide. Following the formation of the initial silicide layer 140, dielectric layers 150, 160, and 170 are formed over the structure as shown in FIG. 2(e). In an embodiment of the instant invention the dielectric layers 150, 160, and 170 can comprise silicon oxide, silicon nitride, and silicon oxide respectively.

Figure 2F:
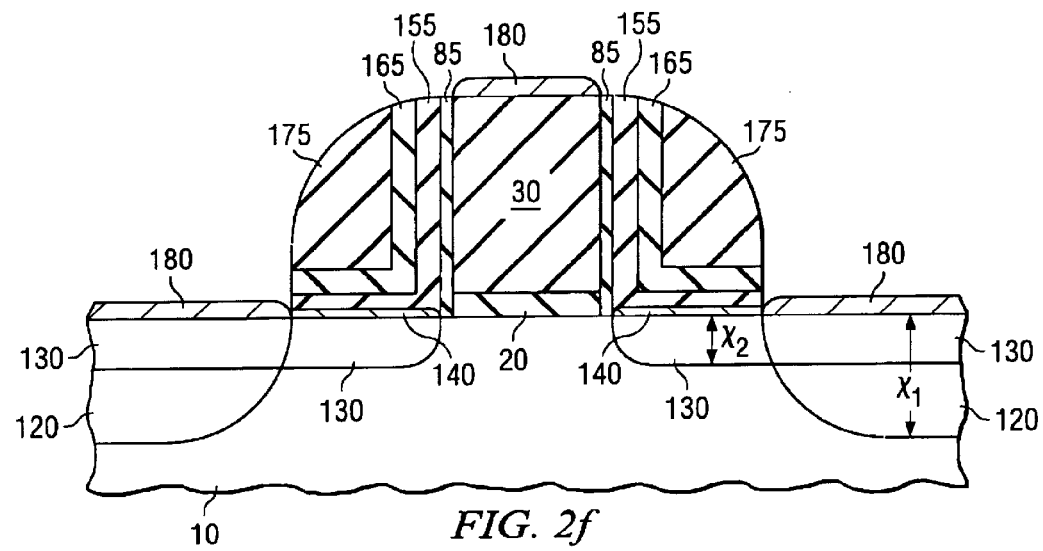

Following the formation of the dielectric layers 150, 160, and 170, an anisotropic etch is performed to form sidewall structures comprising 155, 165, and 175 as shown in FIG. 2(f). During the anisotropic etching process the portion of the initial silicide layer 140 that is underneath the layer 155 is protected from the etching process and remains after the anisotropic etch is complete. The remaining portions of the initial silicide layer 140 are removed during the anisotropic etching process. Following the formation of the sidewall structures comprising 155, 165, and 175 and second silicide layer 180 is formed on the exposed silicon surfaces of the source and drain regions 120 and the transistor gate structure 30. The second silicide layer 180 can comprise cobalt silicide, titanium silicide, nickel silicide, or any other suitable metal silicide. As shown in FIG. 2(f), the second silicide layer 180 is formed over the source and drain regions 120 that have a depth of $x_1$ and the initial silicide layer is formed over the LDD or MDD regions 130 that have a depth of $x_2$ where $x_2$ is less than $x_1$. Furthermore the doping concentration of the region beneath the second silicide layer 180 (i.e. the source and drain regions 120) is higher than the doping concentration of the region beneath the initial silicide layer 140 (i.e. the LDD or MDD regions). Finally, the extension regions 130 on which the initial silicide layers 140 are formed are positioned adjacent the transistor gate structure 30 while the source and drain regions 120 on which the second silicide layer 180 is formed are positioned adjacent the extension 130 (LDD or MDD) regions. Therefore the LDD or MDD regions 130 are positioned between the source and drain regions 120 and the transistor gate structure 30. The initial silicide layer 140 is formed substantially over the LDD or MDD regions 130 and the second silicide layer 180 is formed substantially over the source and drain regions 120. Forming the silicide layer 140 over the extension regions 130 will reduce the series resistance associated with the MOS transistor resulting in improved transistor performance.

Figure 3:
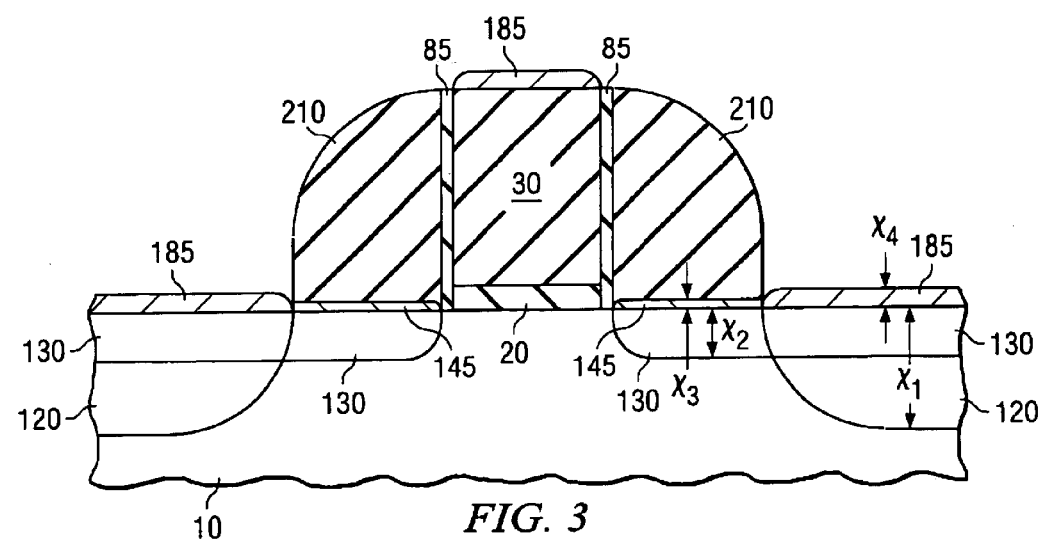
FIG. 3 is a cross-sectional diagram of a further embodiment of a MOS transistor according to an embodiment of the instant invention.

Shown in FIG. 3 is a further embodiment of the instant invention. The initial silicide layer 145 is formed beneath, and prior to, the sidewall structure 210 and is of a thickness $X_3$. The second silicide layer 185 is formed adjacent the sidewall structure 210 and is of a thickness $X_4$ where $x_4$ is greater than $x_3$. As observed in the structure of FIG. 3, the depth $x_1$ of the source drain regions 120 is greater than the depth $x_2$ of the extension regions 130. The initial silicide layer 145 is formed substantially over the extension regions 130 and the second silicide layer 185 is formed substantially over the source and drain regions.

Figure 4:
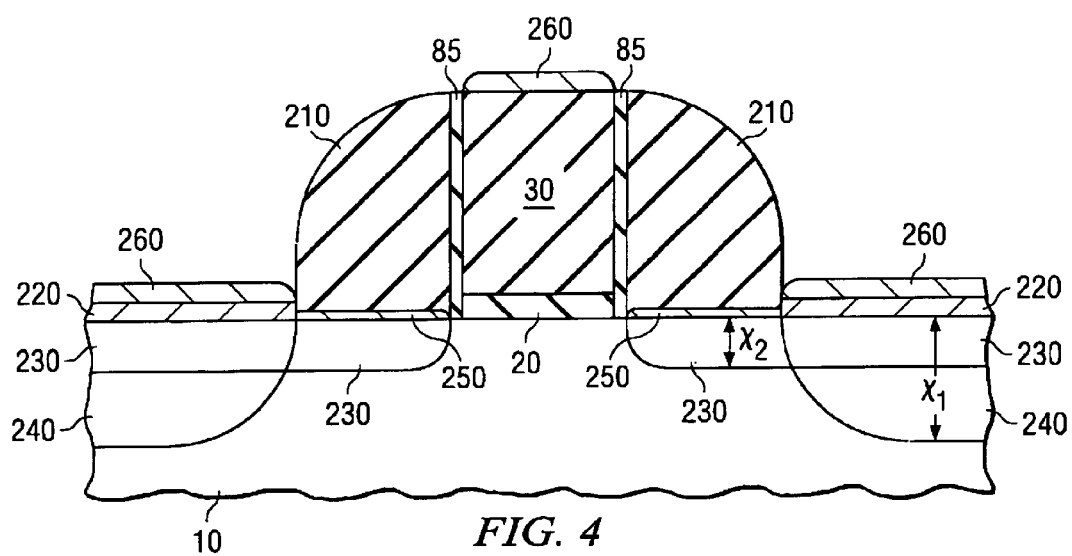
FIG. 4 is a cross-sectional diagram of a further embodiment of a MOS transistor according to an embodiment of the instant invention.

Shown in FIG. 4 is a further embodiment of the instant invention. A semiconductor layer 220 is formed on the surface of the semiconductor 10 following the formation of transistor gate structure 30 and sidewall structure 85. The source and drain regions 240 are formed in both the semiconductor layer 220 and the underlying semiconductor 10 and are called raised source and drain regions. The first silicide layer 250 is formed beneath the sidewall structure 210 on the MDD or LDD regions 230. The second silicide layer 260 is formed adjacent to the sidewall structure 210 on the semiconductor layer 220. The first silicide layer 250 is formed substantially over the extension regions 230 and the second silicide layer 260 is formed substantially over the source and drain regions 240. In the transistor structure shown in FIG. 4, the doping concentration of the source and drain regions 240 is greater than the doping concentration of the source and drain extension regions 230. In addition, the depth $x_2$ of the extension region 230 is less than the depth $x_1$ of the source and drain region 240.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A MOS transistor, comprising:

a gate structure formed over a semiconductor;

source and drain regions formed in said semiconductor;

drain and source extension regions formed in said semiconductor adjacent said gate structure and positioned between said gate structure and said source and drain regions;

first metal silicide layers formed on said drain and source extension regions;

sidewall structures adjacent said gate structure and over said first metal silicide layers; and second metal silicide layers formed on said source and drain regions.

2. The MOS transistor of claim 1 wherein said first metal silicide layer is selected from the group consisting of cobalt silicide, nickel silicide, titanium silicide, and tungsten silicide.

3. The MOS transistor of claim 1 wherein said drain and source extension regions have a first doping concentration and said drain and source regions have a second doping concentration such that said second doping concentration is greater than said first doping concentration.

4. The MOS transistor of claim 3 wherein said drain and source extension regions extend to a first depth and said drain and source regions extend to a second depth such that said second depth is greater than said first depth.

5. An integrated circuit MOS transistor, comprising:

a gate structure formed over a semiconductor;

sidewall structures formed adjacent said gate structure;

a semiconductor layer formed above said semiconductor adjacent to said sidewall structure;

source and drain regions formed adjacent to said sidewall structures in said semiconductor layer and said semiconductor;

drain and source extension regions formed in said semiconductor adjacent said gate structure and positioned substantially beneath said sidewall structures; and first metal silicide layers formed on said drain and source extension regions.

6. The MOS transistor of claim 5 further comprising second metal silicide layers formed on said source and drain regions.

7. The MOS transistor of claim 5 wherein said first metal silicide layer is selected from the group consisting of cobalt silicide, nickel silicide, titanium silicide, and tungsten silicide.

8. The MOS transistor of claim 5 wherein said drain and source extension regions have a first doping concentration and said drain and source regions have a second doping concentration such that said second doping concentration is greater than said first doping concentration.

9. The MOS transistor of claim 8 wherein said drain and source extension regions extend to a first depth and said drain and source regions extend to a second depth such that said second depth is greater than said first depth.

10. A method for forming a MOS transistor, comprising:
   forming a gate structure over a semiconductor;
   forming source and drain regions in said semiconductor;
   forming drain and source extension regions in said semiconductor adjacent said gate structure and positioned between said gate structure and said source and drain regions;
   forming first metal silicide layers on said drain and source extension regions;
   forming sidewall structures adjacent said gate structure and over said first metal silicide layers; and
   forming second metal silicide layers on said source and drain regions.

11. The method of claim 10 wherein said first metal silicide layer is formed from the group consisting of cobalt silicide, nickel silicide, titanium silicide, and tungsten silicide.

12. The method of claim 10 wherein said drain and source extension regions are formed using with a first doping concentration and said drain and source regions are formed using a second doping concentration such that said second doping concentration is greater than said first doping concentration.

13. The method of claim 12 wherein said drain and source extension regions are formed to extend to a first depth and said drain and source regions extend to a second depth such that said second depth is greater than said first depth.

14. An integrated circuit MOS transistor, comprising:
   forming a gate structure over a semiconductor;
   forming sidewall structures adjacent said gate structure;
   forming a semiconductor layer above said semiconductor adjacent to said sidewall structure;
   forming source and drain regions adjacent to said sidewall structures in said semiconductor layer and said semiconductor;
   forming drain and source extension regions in said semiconductor adjacent said gate structure and positioned substantially beneath said sidewall structures; and
   forming first metal silicide layers on said drain and source extension regions.

15. The method of claim 14 further comprising forming second metal silicide layers on said source and drain regions.

16. The method of claim 14 wherein said first metal silicide layer is formed from the group consisting of cobalt silicide, nickel silicide, titanium silicide, and tungsten silicide.

17. The method of claim 14 wherein said drain and source extension regions are formed with a first doping concentration and said drain and source regions are formed with a second doping concentration such that said second doping concentration is greater than said first doping concentration.

18. The method of claim 17 wherein said drain and source extension regions are formed to a first depth and said drain and source regions are formed to a second depth such that said second depth is greater than said first depth.

* * * * *